(12) United States Patent
Wan et al.

(10) Patent No.: US 7,999,624 B2
(45) Date of Patent: Aug. 16, 2011

(54) RADIATION SOURCE

(75) Inventors: Kwun Chiu Wan, Kowloon (HK); Quan Xue, Kowloon Tong (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 11/739,198

(22) Filed: Apr. 24, 2007

(65) Prior Publication Data

US 2008/0265999 A1 Oct. 30, 2008

(51) Int. Cl.
*H03K 3/03* (2006.01)
(52) U.S. Cl. ........ 331/17; 331/1 A; 331/18; 331/25; 331/57
(58) Field of Classification Search .......... 331/1 A, 331/2, 8, 10–12, 16–18, 25, 36 C, 117 R, 331/117 FE, 177 V; 327/2, 5, 9, 12, 105, 327/107, 156–159
See application file for complete search history.

(56) References Cited

U.S. PATENT DOCUMENTS

| | | | | |
|---|---|---|---|---|
| 4,918,405 A * | 4/1990 | Herleikson | ............... | 331/11 |
| 5,325,075 A * | 6/1994 | Rapeli | ............... | 332/103 |
| 5,369,790 A * | 11/1994 | Yokota | ............... | 455/164.1 |
| 5,399,995 A * | 3/1995 | Kardontchik et al. | ........ | 331/17 |
| 5,483,695 A * | 1/1996 | Pardoen | ............... | 455/314 |
| 5,625,324 A * | 4/1997 | Hsu et al. | ............... | 331/2 |
| 6,150,890 A * | 11/2000 | Damgaard et al. | ........ | 331/14 |
| 6,741,846 B1 * | 5/2004 | Welland et al. | ........ | 455/260 |
| 7,095,287 B2 * | 8/2006 | Maxim et al. | ........ | 331/44 |
| 7,109,803 B2 * | 9/2006 | Rebel | ............... | 331/2 |
| 7,298,217 B2 * | 11/2007 | Adlerstein et al. | ........ | 331/12 |
| 7,324,788 B2 * | 1/2008 | Ramet et al. | ........ | 455/76 |
| 7,372,337 B2 * | 5/2008 | Nayler | ............... | 331/16 |
| 7,496,168 B2 * | 2/2009 | Leonowich et al. | ........ | 375/376 |
| 2006/0279363 A1 * | 12/2006 | Shirasu | ............... | 331/16 |

FOREIGN PATENT DOCUMENTS

WO    WO 2005/099086    10/2005

OTHER PUBLICATIONS

Nagra, A.S., et al., "Distributed Analog Phase Shifters with Low Insertion Loss," IEEE Trans. Microw. Theory Tech., vol. 47, No. 9, pp. 1705-1711, Sep. 1999.
Barker, N.S., et al., "Optimization of Distributed MEMS Transmission-Line Phase Shifters—*U*-Band and *W*-Band Designs," IEEE Trans. Microw. Theory Tech., vol. 48, No. 11, pp. 1957-1966, Nov. 2000.

(Continued)

*Primary Examiner* — Shawki S Ismail
*Assistant Examiner* — Christopher Lo
(74) *Attorney, Agent, or Firm* — Stites & Harbison PLLC; Douglas E. Jackson

(57) ABSTRACT

A source of radiation comprises a first low frequency oscillator 200 for providing a reference signal and a plurality of phase shifters 210*a*, 210*b*, 210*c* coupled to the first oscillator. In addition there are a plurality of phase locked loops 230*a*, 230*b*, 230*c*, each phase locked loop having a respective Voltage Controlled Oscillator (VCO) 240*a*, 240*b*, 240*c* for outputting a signal. Each phased locked loop is coupled to a respective one of the phase shifters, so that in use each VCO is phase locked to a reference signal which has been phase shifted by a respective one of the phase shifters. In this way the phase of the radiation output by each VCO may be controlled indirectly by controlling the phase shift of the reference signal. In a preferred embodiment the phase shifters are adjustable to shift the phase by an adjustable amount.

15 Claims, 3 Drawing Sheets

OTHER PUBLICATIONS

Ellinger, F., et al., Varactor-Loaded Transmission-Line Phase Shifter at *C*-Band Using Lumped Elements, IEEE.Trans. Microw. Theory Tech., vol. 51, No. 4, pp. 1135-1140, Apr. 2003.

Hancock, T.M., et al., "A 12-GHz SiGe Phase Shifter With Integrated LNA," IEEE Trans. Microw. Theory Tech., vol. 53, No. 3, pp. 977-983, Mar. 2005.

Lu, J., et al., "Active Phased Array Antenna Based on DDS," IEEE International Symposium, Oct. 14-17, 2003, pp. 511-516 (proceedings), Oct. 2003.

Houghton, A.W., et al., "Phased Array Control Using Phase-Locked-Loop Phase Shifters," IEEE Proceedings-H (Microw., Antennas and Propagation), vol. 139, No. 1, pp. 31-37, Feb. 1992.

Buchanan, N.B., et al., "Triple Mode PLL Antenna Array," IEEE MTT-S Digest, International Microw. Symposium 2004, vol. 3, pp. 1691-1694, Jun. 2004.

York, R.A., et al., "Injection- and Phase-Locking Techniques for Beam Control," IEEE Trans. Microw. Theory Tech., vol. 46, No. 11, pp. 1920-1929, Nov. 1998.

Mak, C.L., et al., "Experimental Study of a Microstrip Patch Antenna with an *L*-Shaped Probe," IEEE Trans. Antennas and Propagation, vol. 48, No. 5, pp. 777-783, May 2000.

Wan, K.-C., et al., "Indirect Controlled Phased Source," IEEE Microw. and Wireless Components Letters, vol. 16, No. 12, pp. 702-704, Dec. 2006.

* cited by examiner

RADIATION SOURCE

FIELD OF THE INVENTION

The present invention relates to a source of radiation, preferably but not necessarily radio frequency radiation. The source may be a phased source in which the phase of the output radiation can be adjusted. One possible application of the invention is as a source for feeding a phased antenna array. It may be particularly advantageous when used for beam steering.

BACKGROUND OF THE INVENTION

Phased antenna arrays typically comprise a group of antennas in which the relative phases of the respective signals feeding the antennas are varied. The phases of the antennas may be arranged in such a way that the effective radiation pattern of the array is reinforced in a desired direction and suppressed in undesired directions. If the phases supplied to the respective antennas can be varied, then the direction of a beam transmitted by the array may be steered.

The beam forming characteristics of phased array antennas make them attractive in the fields of radar, wireless communications, RFID etc.

There are various ways of controlling the phase supplied to each antenna. One popular technique is to use micro-electro-mechanical systems (MEMs) to vary the phase delay on a capacitor diode loaded transmission line. The general arrangement is shown in FIG. 1. An oscillator 1 provides a radio frequency signal, which is split by power divider 10 into two signals, each of which is passed through a respective phase shifter 20, 30. The phase shifters comprise a capacitor diode loaded transmission line having a phase delay, which can be adjusted by varying the arrangement of diodes and capacitors with a MEMs system. Each phase shifter shifts the phase of the signal passing through it by a respective amount and outputs a phase shifted RF signal 40, 50.

This arrangement has several disadvantages. Firstly, the signal energy from the oscillator is put through a power divider and thus the output signal 40, 50 delivered to each antenna decreases as the number of antennas increases. Furthermore power dividers tend to be complicated and lossy and thus add to the expense and further decrease the power delivered. Secondly, as the output signal itself passes through the phase shifters, insertion loss and noise are introduced. Thus, amplifiers are required to compensate the power loss and this makes the system complex and expensive.

Another solution is to use a DDS (Direct Digital Synthesizer) to produce signals having the desired phase directly, at a lower frequency, and then up-converting to a higher frequency.

BRIEF SUMMARY OF THE INVENTION

Accordingly, at its most general, the present invention proposes altering the signal phase indirectly by changing the phase of the phased locked loop's reference signal. Preferably the reference signal has a lower frequency than the output signal. As the reference signal usually has much lower frequency than the output signal, the phase shift control can be achieved easily and cheaply. Another advantage is that in an array each element can be controlled independently and it is not necessary to use a complicated high frequency power dividing system. It may be possible to integrate the low frequency parts of the phase locked loop onto an integrated chip.

DETAILED DESCRIPTION OF THE INVENTION

A first aspect of the present invention provides a source of radiation comprising
 a first oscillator for providing a reference signal having a phase;
 a plurality of phase shifters coupled to said first oscillator, each phase shifter being arranged for phase shifting said reference signal and transmitting a respective phase shifted reference signal;
 a plurality of phase locked loops, each phase locked loop having a respective Voltage Controlled Oscillator (VCO) for outputting a signal;
 wherein each said phase locked loop is coupled to a respective one of said phase shifters, and whereby in use each said VCO is phase locked to a reference signal which has been phase shifted by a respective one of said phase shifters.

Preferably the frequency of the reference signal provided by the first oscillator is less than the frequency of the signal output by the VCOs.

The reference signal may have any suitable frequency. The frequency of the reference signal may normally be lower than 200 MHz, however the present invention is not limited to this. A reference signal having a frequency of 100 MHz or less, 15 MHz or less, or 10 MHz or less may be used. Usually the reference signal will have a frequency of 100 kHz or higher, although the present invention is not limited to this.

The frequency or range of frequencies for the signal output by each VCO may be any appropriate frequency and will be chosen according to the requirements of the system and its intended use. For example, the output frequency of the VCO may be 800 MHz or greater, 900 MHz or greater, 1 GHz or greater, 1.8 GHz or greater, 1.9 GHz or greater, up to 2.4 GHz or ever higher. It would also be possible to have a VCO outputting a frequency less than 800 MHz. Usually, however, the output frequency of each VCO will be greater than the frequency of the reference signal.

Preferably the phase shifters are adjustable phase shifters for adjustably shifting said phase of said reference signal of said first oscillator. The adjustable phase shifters may comprise a variable capacitor, a variable inductor, other components of variable reactance, a delay line of variable length, a switched line configuration, a reflection configuration, and/or any other components or configurations for variable adjusting the phase, as will be apparent to a person skilled in the art.

Preferably each phase shifter has an output for outputting a phase shifted reference signal, each phased locked loop has a phase detector having an input for receiving a phase shifted reference signal and wherein said outputs of said phase shifters are coupled to said inputs of said phased locked loops. There may be a frequency divider positioned between the phase shifter and the phase locked loop and/or a frequency divider positioned on a feedback line between the output of the VCO an input of the phase locked loop. Such frequency dividers enable the frequency to be adjusted to a lower level which can be easily processed by the phase detector. For example, in one preferred embodiment, the frequencies input to the phase detector may be 2 MHz or less.

A second aspect of the present invention provides a phased antenna array comprising a source of radiation according to the first aspect and an array of antennas, each antenna being coupled to a respective one of said VCOs.

A third aspect of the present invention provides a source of radio frequency radiation having adjustable phase, comprising a radio frequency VCO for outputting a radio frequency signal, a low frequency oscillator for producing a low frequency reference signal having a phase, an adjustable phase shifter for adjustably shifting said phase of said low frequency reference signal and outputting a phase shifted reference signal, and a phased locked loop for receiving said phase shifted reference signal and phase locking said radio frequency VCO to said phase shifted reference signal.

Here the term 'low frequency' means that the oscillator outputs a signal having a frequency less than the frequency of the signal output by the VCO. Preferably the low frequency oscillator is arranged for producing a reference signal having a frequency less than 200 MHz, more preferably less than 100 MHz, may be less than 15 MHz and may be less than 10 MHz.

The adjustable phase shifter may comprise any of the components or configurations mentioned above under the first aspect of the present invention.

A fourth aspect of the present invention provides an antenna coupled to a source of radio frequency radiation according to the third aspect of the present invention, said antenna being arranged to transmit said radio frequency output by said VCO.

A fifth aspect of the present invention provides a method of phase shifting a radio frequency signal, comprising the steps of providing a phase locked loop which receives a reference signal and has a radio frequency VCO for outputting a radio frequency signal having a phase, locking said phase of said radio frequency signal output by said VCO to a phase of said reference signal and controllably adjusting said phase of said reference signal so as to give a desired change in phase of said radio frequency signal output by said VCO.

Preferably the reference signal has a frequency less than the frequency output by the VCO. Regarding the frequencies chosen, the same comments apply as for the first aspect of the present invention, discussed above.

DETAILED DESCRIPTION OF THE DRAWINGS

Figure 1:
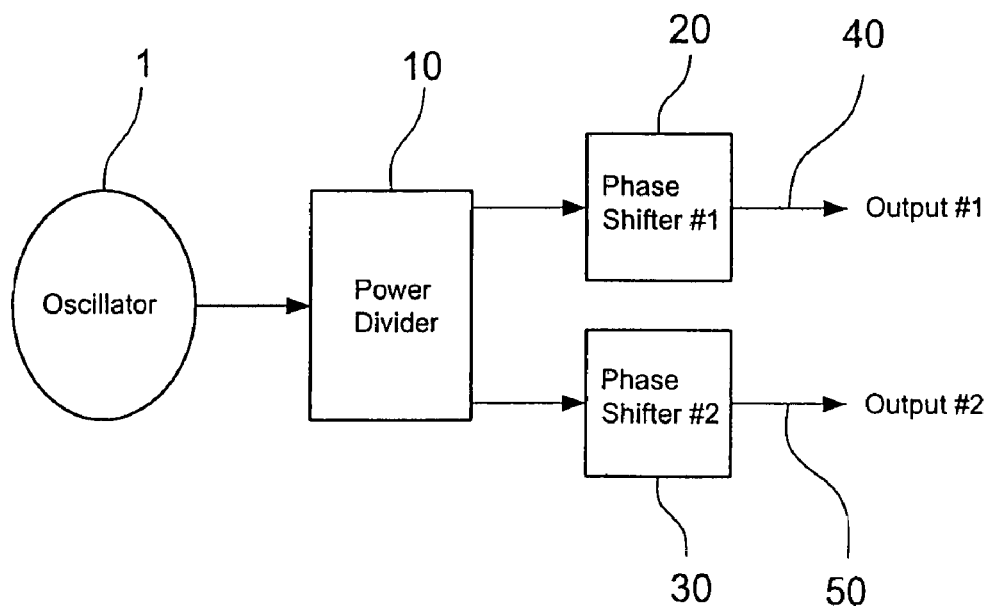
FIG. 1 is a schematic diagram of a prior art phased array.
Figure 2:
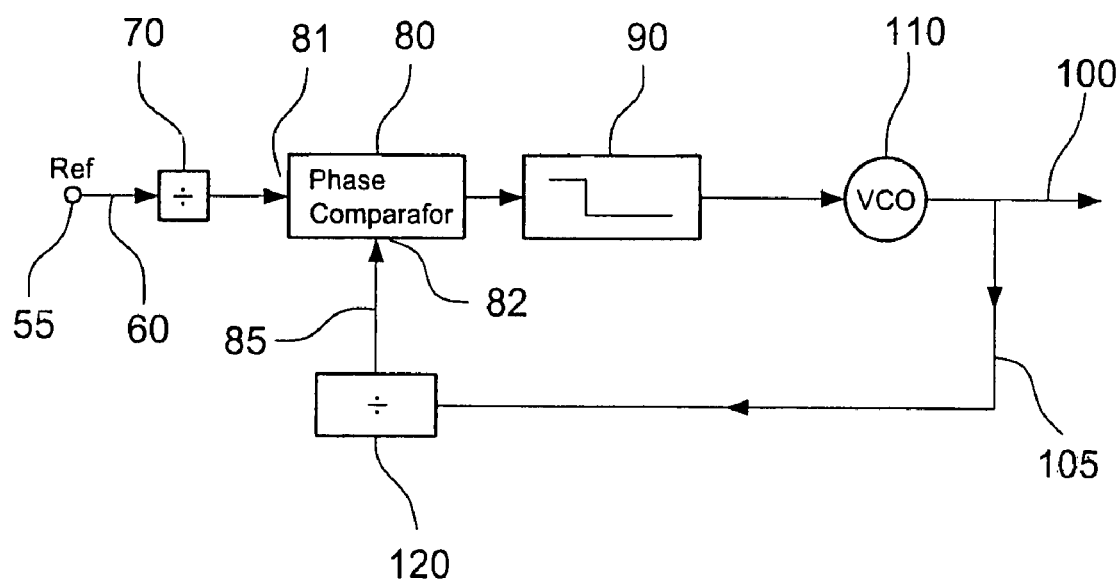
FIG. 2 is a schematic diagram of a phased locked loop.

FIG. 2 shows a typical phase locked loop (PLL). It is by way of example only and should not be taken to be limiting, as there are many types of phase locked loop which are known to a person skilled in the art and which may be utilized with the present invention.

As shown in FIG. 2, a typical phase locked loop receives a reference signal 60 and has a Voltage Control Oscillator (VCO) 110, which outputs a signal which is split into output 100 and the feedback loop 105. The phase locked loop comprises a phase detector or comparator 80 having a first input 81 for receiving the reference signal 60 and a second input 82 for receiving a feedback signal 85. The output from the phase comparator 80 is to a loop filter 90 which provides a corresponding input voltage to the VCO 110. In the phase locked loop of FIG. 2 the feedback loop acts to maintain a zero phase—difference between the two frequencies inside the phase comparator in order to clamp VCO to a desired output frequency. Where there is no difference in frequency between the two signals inside the phase comparator, the output will be zero and the VCO maintains a steady state, however where there is a difference, the phase comparator and loop filter 90 output a correcting voltage which causes the VCO to revert back to the same frequency as the reference signal. Optionally, a frequency divider 70 may be provided between an oscillator 55 which provides a reference signal and the first input 81 of the phase detector 80. Likewise, a frequency divider 120 may be provided between the output of VCO and the second input 82 of the phase comparator 80. This enables the phase comparator to operate at a lower frequency then either the VCO or the reference signal 55.

Figure 3:
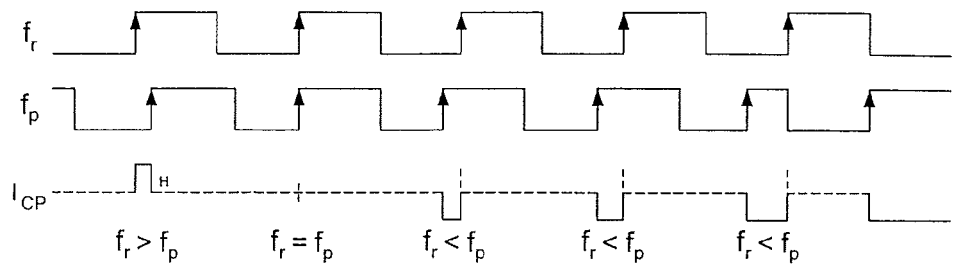
FIG. 3 is a graph showing frequencies inside the phase comparator of a phased locked loop.

As shown in FIG. 3, the two frequencies inside the phase comparator are $F_p$ and $F_r$, where $F_p$ is a feedback frequency derived from the VCO output and $F_r$ is a reference frequency derived from the reference oscillator. Clearly the phase of the VCO signal is locked in a correlative manner to the reference oscillator signal according to the principle of the PLL frequency locking technique. It can be seen in FIG. 3, when the PLL is locked at a steady state, $F_r$ should be equal in phase with $F_p$. The two frequencies $F_r$ and $F_p$ inside the phase comparator should theoretically be equal to $$\frac{\omega_{rf}}{N} = \frac{\omega_{ref}}{R}$$

so that $$\frac{N}{R} = \frac{\omega_{rf}}{\omega_{ref}}$$

Where $\omega_{ref}$ is the frequency of reference signal, and $\omega_{rf}$ is the frequency of the VCO, and N and R are constants that represent the divide ratio of the two frequency dividers 120 and 170 in FIG. 2.

Similarly, the phase of the VCO output, $\theta_{rf}$ and the phase of the reference signal, $\theta_{ref}$ are related with each other according to the equation:

$$\frac{\theta_{rf}}{N} = \frac{\theta_{ref}}{R}$$

Therefore:-

$$\frac{\theta_{rf}}{\theta_{ref}} = \frac{N}{R} = \frac{\omega_{rf}}{\omega_{ref}} = M$$

Where M is the phase shift relation factor between VCO signal and the reference signal. M should be a constant.

From the above, it can be seen that the phase of the VCO output can be controlled by the PLL indirectly, while we control the phase of reference signal, in case of the frequency synthesizer system locked at steady state.

Figure 4:
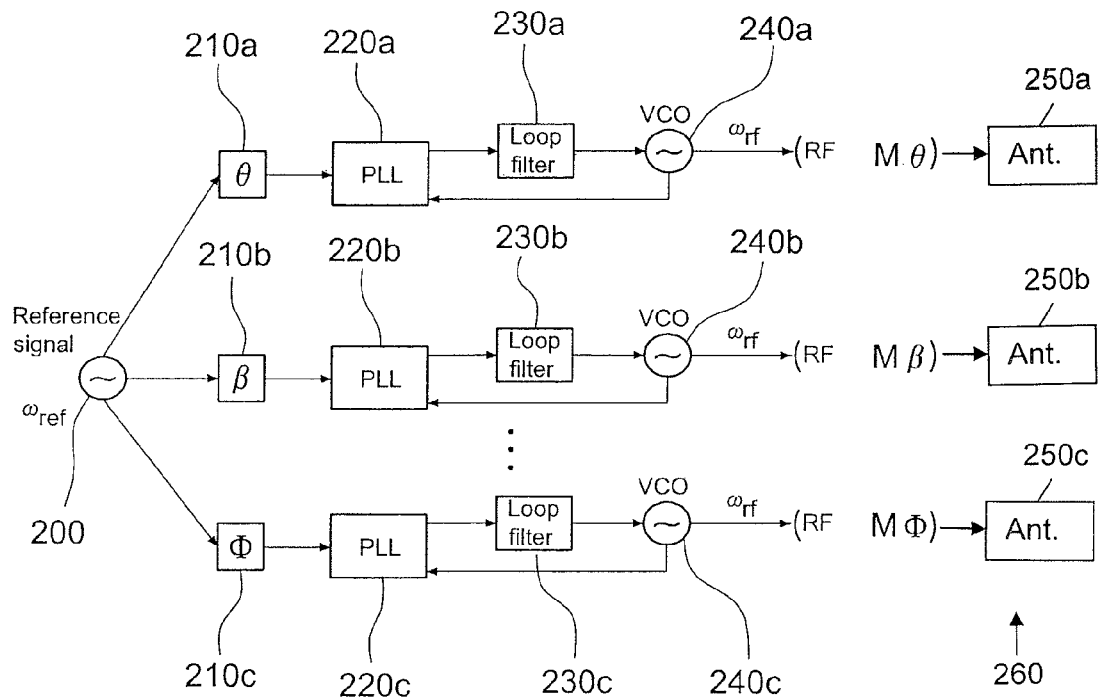
FIG. 4 is a schematic diagram of a phased array according to an embodiment of the present invention.

A source of radio frequency radiation for supplying a phased antenna array is shown in FIG. 4. A first oscillator 200 provides a reference signal of frequency $\omega_{ref}$. It is best if the reference signal has a low frequency which can easily be processed by the phase comparators in phase locked loops, for example a frequency of 1 MHz or below. The oscillator 200 is coupled to three phase shifters 210A, 210B and 210C on three separate paths. Each of the phase shifters 210A, 210B, 210C is independent of the others and is arranged to receive the reference signal $\omega_{ref}$, shift the phase of the reference signal by a certain amount and transmit a phase shifted reference signal to a respective phase locked loop (PLL) 220A, 220B or 220C. In the example shown in FIG. 4 each phase shifter is arranged to shift the phase of the reference signal by a different amount. For example, the first phase shifter 210A is arranged to introduce a phase delay of $\theta$, the second phase shifter 210 is arranged to delay the phase by an amount $\beta$ and the third phase shifter 210C is arranged to introduce a phase delay of $\Phi$. Each phase shifter may be arranged to introduce a fixed pre-determined phase delay, or alternatively each phase shifter may be adjustable such that the phase delay which it introduces may be varied.

Each phase shifter 210A, 210B, 210C outputs a phase shifted reference signal to a respective phase locked loop 220A, 220B or 220C. The phase locked loop 220A outputs a voltage through to loop filter 230A in order to control VCO 240A which outputs a radio frequency signal, $\omega_{ref}$ to an antenna 250a. The phase of the radio frequency signal output by the VCO is shifted by $M\theta$ with respect to the reference signal $\omega_{ref}$, where M is the phase shift relation factor defined above. Phase locked loop 220B, loop filters 230B, 230C and VCOs 240B and 240C are arranged in a similar fashion and output radio frequency signals phase shifted by amounts $M\beta$ and $M\phi$ respectively to antennas 250b and 250c of array 260.

The circuits labelled PLL 220A, 220B and 220C in FIG. 4 may comprise a phase comparator and two frequency dividers as shown in the example phase locked loop in FIG. 2.

As mentioned above, the phase shifters may be configured to adjust the phase by a pre-determined fixed amount. The phase shifters may for example be loaded coaxial lines, components having a certain reactance, or any other arrangement for shifting phase as will be apparent to a person skilled in the art.

Figure 5:
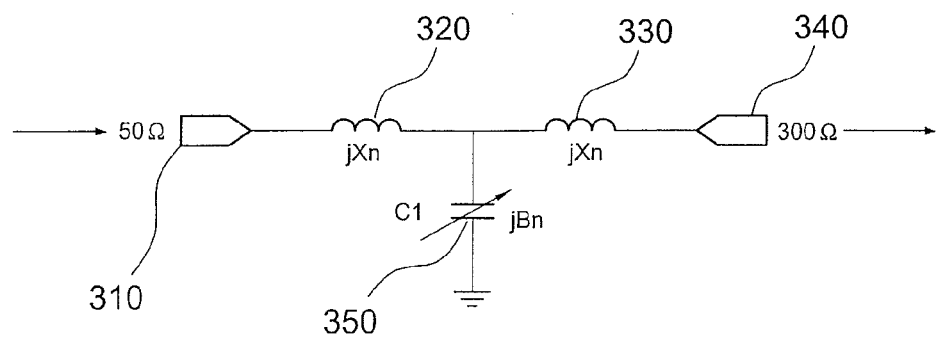
FIG. 5 is a circuit diagram of one type of adjustable phase shifter for shifting the phase of a signal by a variable amount.

Alternatively, each phase shifter may be adjustable so that it is capable of varying the amount by which it shifts the phase of a signal passing through it. There are many possible arrangements of phase shifter which will be apparent to a person skilled in the art—for example, switched line phase shifters, mirror phases shifters, phase shifters with variable inductors, variable capacitors or other components having a variable reactance. An example of one suitable type of adjustable phase shifter is shown in FIG. 5. Two resistors 310, 340 are arranged in series with two inductors 320, 330 and in parallel with an adjustable capacitor 350. By adjusting the capacitance of the capacitor 350, the phase delay can be adjusted. The phase shifter shown in FIG. 5 is capable of adjusting the phase to a very high resolution. This is important because there will usually be a high frequency ratio between the low frequency reference signal $\omega_{ref}$ and the radio frequency signal $\omega_{rf}$ generated by the VCO. A transmission type low pass phase shifter may be used, preferably with high cut-off frequency, to enable fine phase shifting control.

The phase shift generated by the particular adjustable phase shifter shown in FIG. 5 can be calculated from the following equations.

$$\phi_{RF} = \frac{f_{RF}}{f_{LF}}\phi_{LF} \qquad (1)$$

$$\phi_{LF} = \beta + \tan^{-1}\frac{R_0(X_L - X_C)}{X_L(2X_C - X_L)} \qquad (2)$$

$$X_C = \frac{1}{2\pi f_{LF} C} \qquad (3)$$

$$X_L = 2\pi f_{LF} L \qquad (4)$$

where,
$\beta$=initial phase
$R_0$=input impedance of the PLL
$f_{RF}$=ICPS output frequency
$f_{LF}$=LF reference oscillator frequency
C=the capacitance of the capacitor
L=the inductance of each inductor
and where $\phi_{LF}$ is the phase shift of the low frequency phase shifter and $\phi_{RF}$ is the phase of the indirect-controlled-phased-source output.

Figure 6:
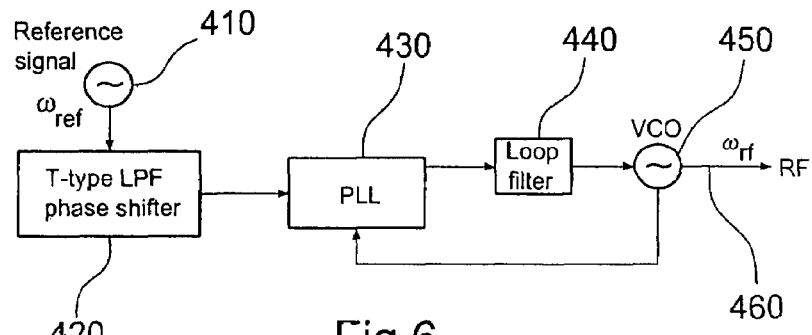
FIG. 6 is a schematic diagram of a source of radio frequency radiation according to an embodiment of the present invention.

The present invention will be especially useful when it is used as a source of radio frequency signals for a phased antenna array. However, it may also be used to provide a single radio frequency signal having a highly controllable phase. An example of such an arrangement is shown in FIG. 6. A reference signal 410 is generated by a local oscillator and passed through an adjustable phase shifter 420 to a phased locked loop 430 which controls a VCO 450 via loop filter 440. The phase of the radio frequency signal 460 output by the VCO 450 is locked to the phase of the reference signal 410. The reference signal 410 is phase shifted by the phase shifter for 420. Thus by adjusting the phase delay provide by the phase shifter 420, the phase of the output radio frequency signal 460 may be adjusted.

A 4-element phased array antenna according to an embodiment of the present invention was developed to test the idea of a PLL controlled phase shifter. The set up was simulated by computer and then carried out in practice. In the experimental system, the low frequency phase shifter comprised a high temperature stability inductor and a variable capacitor comprising a set of high temperature stability capacitors with different values in the order of binary increment connected to a DIP switch. This arrangement could be easily controlled by a microcontroller and is suitable for use with a compact smart antenna.

Figure 7:
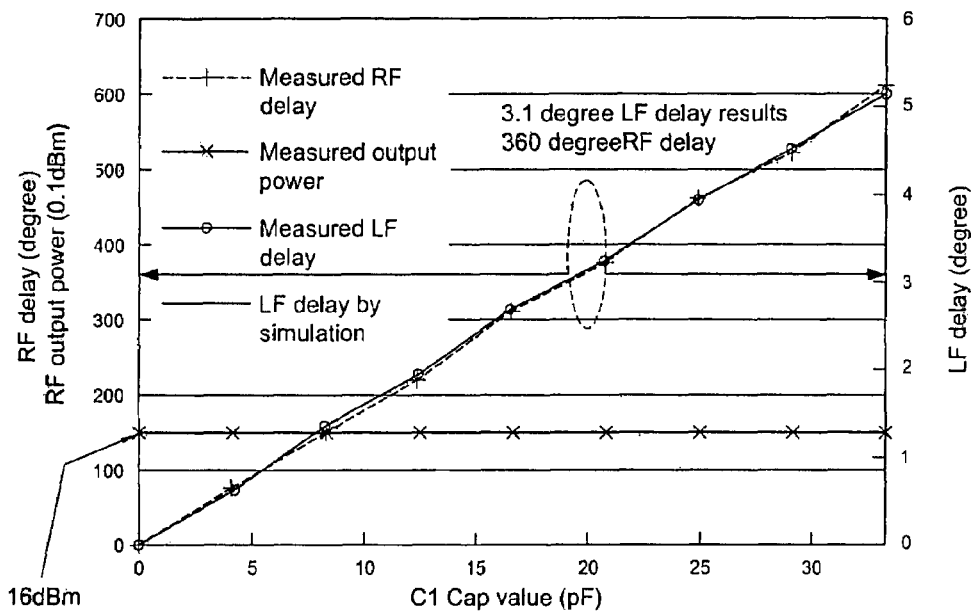
FIG. 7 is a graph showing the RF delay and LF delay found in an experiment.

The overall set up of the system was the same as that shown in FIG. 4. The performance of the PLL controlled phase shifter is shown in FIG. 7. The operating frequency was selected to be 1.14 GHz, the reference signal was chosen to be 10 MHz and a frequency divider was used in order to have a 1 MHz reference frequency inside the phase comparator. The phase delays were measured by a Hewlett Packard Infinium high speed 1.5 GHz digital oscilloscope.

FIG. 7 shows that the experimental results are very close to the expected results from the simulations. The curves of measured RF delay, measured LF delay and the LF delay in the simulation almost overlap with each other. The output power keeps constant at 16 dBm under different degrees of RF phase shift. The LF (low frequency/reference signal) phase shift varies linearly with the control capacitor's capacitance value. The maximum phase error over the 600° RF phase shift was only 6°. This error was probably mainly caused by component errors in the LF phase shifter as we can see there is some error in the curve of measured LF delay, and this LF delay error leads to a corresponding RF delay error. It will be possible to control the accuracy better than 6° if the component quality is properly controlled. Higher phase shifts can be achieved by further increasing the capacitor value in the LF phase shifter.

Figure 8:
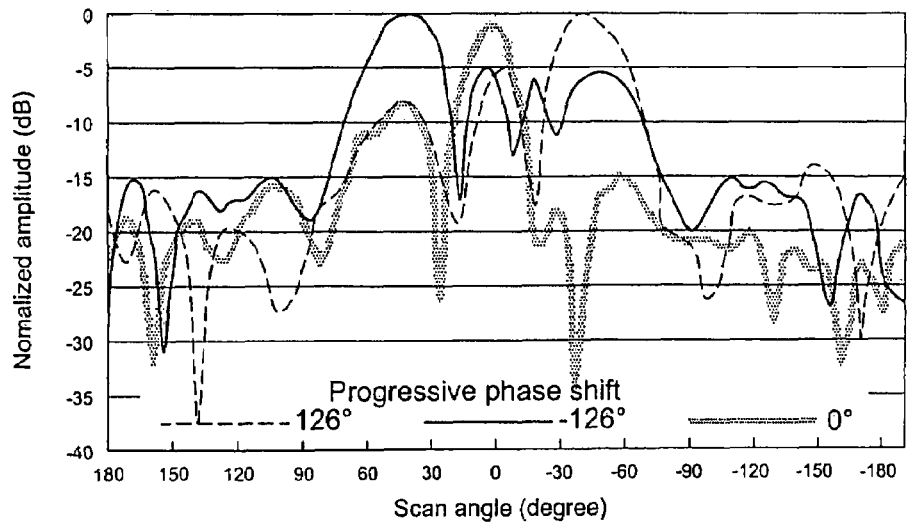
FIG. 8 shows the scan pattern produced by a phased array according to an embodiment of the present invention.

The experimental results of scan patterns with a 4-element phased array antenna are shown in FIG. 8. An L-probe patch antenna was employed together with a 4-element phased array with separation of 0.55λ. FIG. 8 shows 3 beams with 126°, −126° and 0° beam scan angles obtained by −40°, 40° and 0° progressive phase shifts respectively. The phase difference between the two extreme elements was 378° when ±126° progressive phase shift was set, which was the closest setting to 360° in the digital phase shifter used in the experiment and this was the setting for the largest scan angle of 40° obtained in the experiment.

What is claimed is:

1. A source of radiation having a circuit for controlling respective output phases of a plurality of VCOs comprising:
    a first oscillator for providing a reference signal having a phase;
    at least first and second phase shifters coupled to said first oscillator, said first phase shifter being arranged for phase shifting said reference signal and transmitting a first phase shifted reference signal, and said second phase shifter being arranged for phase shifting said reference signal and transmitting a second phase shifted reference signal;
    at least first and second phase locked loops, said first phase locked loop having a first VCO for outputting a first signal, and said second phase locked loop having a second VCO for outputting a second signal;
    wherein said first phase locked loop is coupled to said first phase shifter, and said second phase locked loop is coupled to said second phase shifter;
    whereby in use said first signal output by said first VCO is phase locked to said first phase shifted reference signal and said second signal output by said second VCO is phase locked to said second phase shifted reference signal; and
    whereby the phases of said first and second signals are controlled by said first and second phase shifted reference signals to be different from each other.

2. The source of radiation according to claim 1 wherein said phase shifters are adjustable phase shifters for adjustably shifting said phase of said reference signal of said first oscillator.

3. The source of radiation according to claim 2 wherein each said adjustable phase shifter comprises a variable capacitor.

4. The source of radiation according to claim 1 wherein each said phase shifter has an output for outputting a phase shifted reference signal, each phased locked loop has a phase detector having an input for receiving a phase shifted reference signal and wherein said outputs, of said phase shifters are coupled to said inputs of said phased locked loops.

5. The source of radiation according to claim 1 wherein said VCOs are radio frequency VCOs for outputting a radio frequency signal.

6. The source of radiation according to claim 1 wherein said first oscillator is arranged for producing a reference signal having a frequency less than 200 MHz.

7. The source of radiation according to claim 1 wherein said first oscillator is arranged for producing a reference signal having a frequency less than 15 MHz.

8. A phased antenna array comprising the source of radiation according to claim 1 and an array of antennas, each antenna being coupled to a respective one of said VCOs.

9. A source of radio frequency radiation having a circuit for adjustably controlling an output phase of a radio frequency VCO, comprising:
    a radio frequency VCO for outputting a radio frequency signal,
    a low frequency oscillator for producing a low frequency reference signal having a phase,
    an variable phase shifter for adjustably shifting said phase of said low frequency reference signal and outputting a phase shifted reference signal, and
    a phase comparator having
        a first input for receiving said phase shifted reference signal,
        a second input for receiving a feedback signal derived from an output of said radio frequency VCO, and
        an output for outputting a control signal for controlling said output phase of said radio frequency VCO, said control signal acting to phase lock said radio frequency VCO to said phase shifted reference signal,
        a first frequency divider coupled between said low frequency oscillator and said first input of said phase comparator;
    whereby a phase of said radio frequency signal output by said radio frequency VCO is controlled by adjusting said phase shifted reference signal of said variable phase shifter.

10. The source of radio frequency radiation according to claim 9 wherein said low frequency oscillator is arranged for producing a reference signal having a frequency less than 200 MHz.

11. The source of radio frequency radiation according to claim 9 wherein said low frequency oscillator is arranged for producing a reference signal having a frequency less than 15 MHz.

12. The source of radio frequency radiation according to claim 9 wherein said variable phase shifter comprises a variable capacitor.

13. An antenna coupled to the source of radio frequency radiation according to claim 9, said antenna being arranged to transmit said radio frequency output by said radio frequency VCO.

14. A method of phase shifting a radio frequency signal, comprising the steps of:
    providing a reference signal having a phase by an oscillator;
    providing a phase locked loop which includes
        a radio frequency VCO for outputting a radio frequency signal having a phase, and
        a phase comparator having a) a first input for receiving said reference signal, b) a second input for receiving a feedback signal derived from the output of said radio frequency VCO, and c) an output for outputting a control signal for controlling said output phase of said radio frequency VCO;

dividing a frequency of said reference signal by a first frequency divider coupled between said first input of said phase comparator and said oscillator;
using said phase locked loop to lock said phase of said radio frequency signal output by said radio frequency VCO to a phase of said reference signal; and
variably adjusting said phase of said reference signal to produce a phase adjusted reference signal; and
inputting said phase adjusted reference signal to said first input of said phase comparator, so as to give a desired change in phase of said radio frequency signal output by said radio frequency VCO.

15. The method according to claim 14 wherein said reference signal has a frequency less than 200 MHz.

* * * * *